United States Patent
Pöchmüller

(10) Patent No.: US 6,314,018 B1
(45) Date of Patent: Nov. 6, 2001

(54) INTEGRATED MEMORY WITH AT LEAST TWO PLATE SEGMENTS

(75) Inventor: Peter Pöchmüller, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/662,257

(22) Filed: Sep. 14, 2000

(30) Foreign Application Priority Data

Sep. 14, 1999 (DE) .............................. 199 44 036

(51) Int. Cl.$^7$ .................................. G11C 11/24
(52) U.S. Cl. ...................... 365/149; 365/145; 365/201
(58) Field of Search ............................ 365/145, 149, 365/201

(56) References Cited

U.S. PATENT DOCUMENTS

| | | | |
|---|---|---|---|
| 5,373,463 | 12/1994 | Jones, Jr. .................. | 365/145 |
| 5,400,275 | 3/1995 | Abe et al. .................. | 365/145 |
| 5,973,981 | * 10/1999 | Lee ........................ | 365/49 |
| 6,122,190 | * 9/2000 | Ooishi ...................... | 365/201 |

\* cited by examiner

*Primary Examiner*—Tan T. Nguyen
(74) *Attorney, Agent, or Firm*—Herbert L. Lerner; Laurence A. Greenberg; Werner H. Stemer

(57) ABSTRACT

One electrode of each storage capacitor C of the memory cells MC is connected via the associated memory transistor T to one of the bit lines BLi and another electrode is connected to one of the plate segments PLA, PLB; PLC, PLD. A control terminal of each selection transistor T is connected to one of the word lines WLi. In a normal operating mode, the potential of only one of the plate segments in each case is pulsed in the event of accesses to the memory cells MC. In a test operating mode, the potentials of both plate segments are pulsed simultaneously.

8 Claims, 3 Drawing Sheets

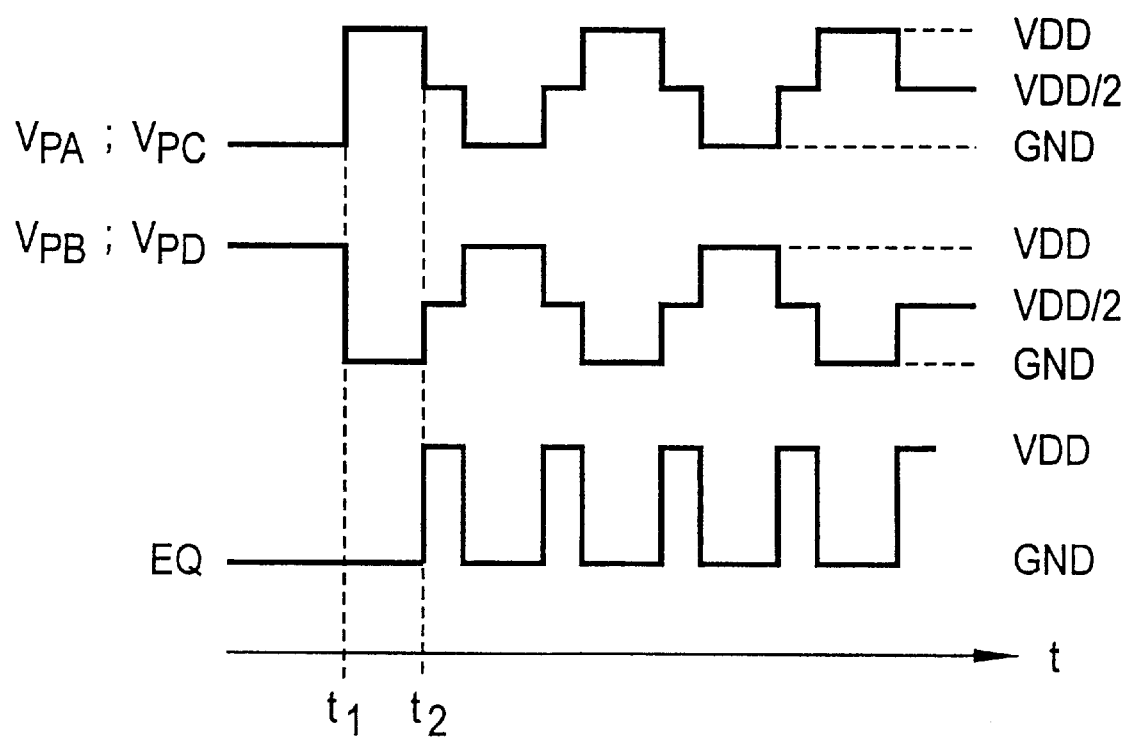

INTEGRATED MEMORY WITH AT LEAST TWO PLATE SEGMENTS

BACKGROUND OF THE INVENTION

Field of the Invention

The invention relates to an integrated memory having memory cells, which are arranged within a cell array along bit lines, word lines and at least two plate segments and each have a selection transistor and a storage capacitor, one electrode of each storage capacitor being connected via the associated selection transistor to one of the bit lines and another electrode being connected to one of the plate segments, and a control terminal of each selection transistor being connected to one of the word lines.

An integrated memory of this type in the form of an FRAM (Ferro-Electric Random Access Memory) is described in U.S. Pat. No. 5,373,463, which shows a first variant of an FRAM in which the plate segments are arranged parallel to the word lines, each plate segment being assigned to a word line. Another variant is shown, furthermore, in which plate segments run parallel to the bit lines, each plate segment being assigned to a bit line. The memories described in U.S. Pat. No. 5,373,463 operate according to the so-called "Pulsed plate concept". When information items are being written to or read from the memory cells, one of the word lines is activated, so that the associated selection transistors are switched on, and then the plate segment assigned to that memory cell which is intended to be accessed is brought firstly to a high supply potential and then to a low supply potential of the memory, that is to say is pulsed. Each access to one of the memory cells is thus connected with pulsing of the associated plate segment.

In ferroelectric memory cells, whose storage capacitors have a ferroelectric dielectric, aging phenomena such as the socalled "imprint" or the so-called "fatigue" occur and can lead to functional disturbances of the memory. Therefore, it is important, in the context of a memory test, to check whether the memory cells satisfy at least certain minimum requirements imposed on their resistance to aging. In order to check the aging effects, it is possible to carry out a large number of write and/or read accesses to each memory cell. Finally, the functionality of each cell is checked, so that it can be ascertained whether first defects rendering use of the memory impossible have already occurred on account of premature aging. Since today's memories have a multiplicity of memory cells, the above-described testing of the memory cells is very time-consuming.

SUMMARY OF THE INVENTION

The invention is based on the object, therefore, of specifying an integrated memory of the type mentioned in which it is possible to test the memory cells by carrying out a multiplicity of memory accesses with a reduction in the time needed.

This object is achieved by means of an integrated memory in accordance with patent claim 1. The dependent claims relate to advantageous designs and developments of the invention.

The memory cells of the memory according to the invention are each connected to one of at least two plate segments. In a normal operating mode of the memory, accesses are made to the memory cells by the potential of only one of the plate segments in each case being pulsed. In a test operating mode, by contrast, the potentials of both plate segments are pulsed simultaneously.

The invention is based in the insight that although accesses have to be carried out exactly to individual memory cells during normal operation of a memory, this is not necessary for artificial aging of the memory cells in a test operating mode. Rather, access can be made to a larger number of memory cells in the test operating mode than in the normal operating mode. According to the invention, this is done by pulsing a different number of plate segments in the two operating modes.

According to one development of the invention, the potentials of the two plate segments are pulsed simultaneously in each case in the opposite direction in the test operating mode. This means that the plate segments assume complementary levels, which may be supply potential levels of the memory, for example, in the test operating mode. What this achieves is that effects which occur on account of capacitive couplings between the plate segments and the bit lines, on the one hand, and between the plate segments and the word lines, on the other hand, mutually compensate one another at least in part. This compensation is greater, the nearer the two plate segments are arranged to one another. Therefore, it is particularly advantageous if the plate segments are arranged directly adjacent to one another.

According to a further development of the invention, the potentials of the two plate segments are pulsed, in the test operating mode, in each case by two successive pulses with opposite levels in each case, and the memory has a short-circuiting element, which connects the two plate segments to one another and is temporarily switched on prior to the second pulsing of the plate potentials.

What this achieves is that prior to the pulsing of the two plate segments to opposite levels in each case, charge balancing is effected via the conductive short-circuiting element, so that less power is needed to achieve the level that is subsequently to be pulsed than in the case without short-circuiting.

According to one embodiment of the invention, the plate segments run parallel to the word lines and, in the test operating mode, for each plate segment, at least one of the associated word lines is activated during the pulsing of the plate potentials.

This means that during the pulsing of the plate potentials for the two plate segments, opposing charge transfers occur on those bit lines which are assigned to memory cells which are accessed in each case. These opposing charge transfers or currents having an opposite sign result from the opposite potential pulses of the two plate segments. Through the activation of a respective word line for each plate segment, memory cells both of one and of the other plate segment are connected to the same bit line via their selection transistors. Whereas, by way of example, a positive current flows onto the bit lines on account of a positive pulse on one plate segment, the negative pulse on the other plate segment effects a corresponding negative pulse on the same bit line. The two currents having an opposite sign compensate one another at least in part on the bit line. Through the compensation of the simultaneously flowing positive and negative charges, no large electrical charges have to be carried away by the bit lines. Corresponding lines which can carry large currents are not necessary, therefore, in the case of the invention. Particularly if the two simultaneously pulsed plate segments are arranged adjacent to one another, local balancing or compensation currents flow only in partial regions of the affected bit lines. This avoids relatively large parasitic voltage drops along the bit lines.

According to another embodiment of the invention, the plate segments are arranged parallel to the bit lines and, in the test operating mode, for each plate segment, at least one of the associated word lines is activated. Moreover, the memory has a potential line for a fixed potential and also at least two short-circuiting elements, via which one of the bit lines assigned to each plate segment is respectively connected to the potential line and which are both in the on state in the test operating mode during the pulsing of the plate potentials.

Since the plate segments run parallel to the bit lines in this embodiment, the simultaneous pulsing of both plate segments does not concern the same bit line. Therefore, the short-circuiting elements and the potential lines are necessary in order to achieve the charge compensation—described further above—during the opposite pulsing of the plate segments. In this embodiment, then, the charge compensation takes place between two bit lines which are assigned to different plate segments. Otherwise, the statements regarding the embodiment explained above apply to this embodiment of the invention.

In both embodiments of the invention explained above, it is possible for more than one word line to be activated simultaneously for each plate segment in the test operating mode. As a result, the number of memory cells accessed simultaneously can be multiplied. Through the charge or current compensation outlined, no extremely large currents occur on the bit lines despite the simultaneous access to a large number of memory cells.

The invention is explained in more detail below with reference to the figures, which illustrate exemplary embodiments.

BRIEF DESCRIPTION OF THE DRAWINGS

FIG. 3 shows potential profiles of plate segments from FIGS. 1 and 2.

DESCRIPTION OF THE PREFERRED EMBODIMENT

Figure 1:
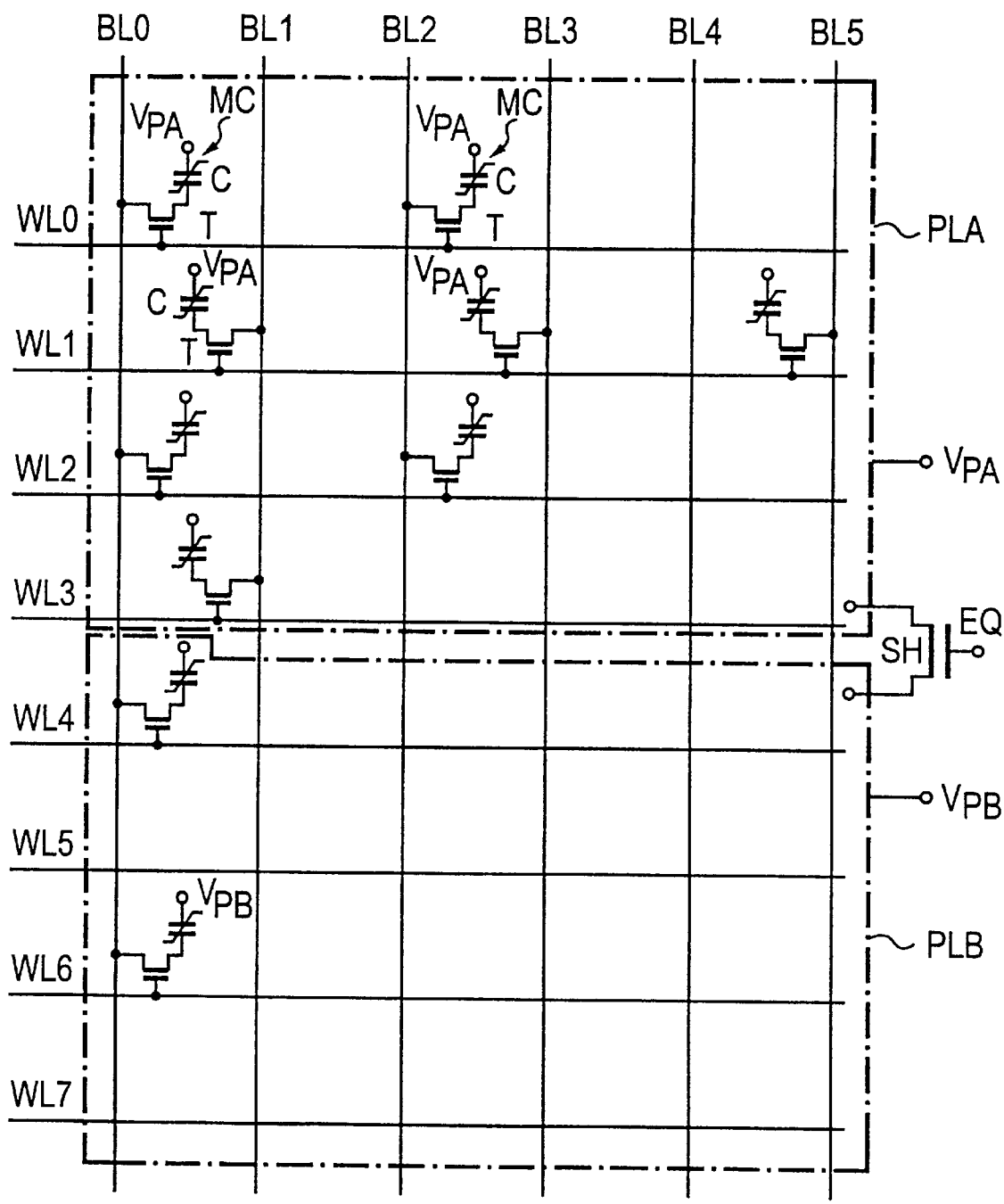
FIG. 1 shows a first exemplary embodiment of the invention.

FIG. 1 reveals a detail of a memory cell array of an integrated memory of the FRAM or FeRAM type. The memory cells MC are arranged at crossover points of bit lines BLi and word lines WLi. Each memory cell MC has a selection transistor T and a storage capacitor C with a ferroelectric dielectric. One electrode of each storage capacitor C is connected via the controllable path of the associated selection transistor T to one of the bit lines BLi. The other electrode of the storage capacitor C is connected to one of two plate segments PLA, PLB. The gate of the selection transistor T is connected to one of the word lines WLi.

The plate segments PLA, PLB run parallel to the word lines WLi. Four of the word lines in each case are assigned to one of the plate segments. This means that the memory cells connected to said word lines are connected to the corresponding plate segment. Although only six bit lines BLi are illustrated in FIG. 1, in reality the memory has a much greater number of bit lines. Moreover, in addition to the two plate segments PLA, PLB illustrated in FIG. 1, it has further identical plate segments which are each once again assigned four of the word lines WLi. Potentials $V_{PA}$, $V_{PB}$ generated by corresponding potential generators are fed to the plate segments PLA, PLB.

The two plate segments PLA, PLB are connected to one another via a short-circuiting element SH in the form of an n-channel transistor, which short-circuits both segments in a manner dependent on a control signal EQ at its gate.

The method of operation of the circuit shown in FIG. 1 is as follows: in a normal operating mode of the memory, when one of the memory cells MC is accessed, one of the word lines WLi, for example the word line WL1, is activated, that is to say brought to a high level. As a result, the selection transistors T of those memory cells which are connected to the word line WL1 are switched on. Afterwards, the plate segment assigned to the respective activated word line WL1 in this case the upper plate segment PLA in FIG. 1, is pulsed firstly to a high and then to a low supply potential of the memory. In the event of a read access, depending on the datum which is respectively stored in the storage capacitor and results in different polarization of the ferroelectric dielectric of the storage capacitor C, the potential of the associated bit line BL 1, BL 3, BL 5 is altered to different extents. Selection of one of the three affected bit lines BL 1, BL 3, BL 5 ultimately decides which datum is read out in an amplified fashion to a point outside the memory.

In the normal operating mode, it is always the case that only the potential of one of the plate segments PLA, PLB is pulsed, namely that which is assigned to a respective word line WLi to be activated. Compared with a plate which is of whole-area design and is common to all the memory cells MC, the segmentation of the plate has the advantage that during the pulsing of the potentials of the individual plate segments, influences that result therefrom concern only a limited number of memory cells, which are not intended to be accessed at all during the present access.

In a test operating mode of the memory, all four word lines WLi of each plate segment PLA, PLB are activated simultaneously, so that all the memory cells MC connected thereto are conductively connected to the bit lines BLi. Both plate segments PLA, PLB are subsequently pulsed simultaneously. The effect achieved as a result of this is that an access to all the memory cells MC simultaneously is simulated. In this way, artificial aging of all the memory cells MC can be brought about in a short time.

FIG. 3 shows the profiles of the plate potentials $V_{PA}$, $V_{PB}$ in the test operating mode. All of the word lines WLi are activated during the period of time considered. Three successive pulses are illustrated. At an instant $t_1$, the potential $V_{PA}$ of the upper plate segment PLA from FIG. 1 has the value of a high supply potential VDD, while the potential $V_{PB}$ of the lower plate segment PLB assumes a low potential GND. As a result of the positive edge of the potential $V_{PA}$, positive charges are transferred onto the bit lines BLi from the memory cells MC connected to the upper plate segment PLA. As a result of the negative edge of the potential $V_{PB}$, negative charges are transferred onto the bit lines BLi from the memory cells MC connected to the lower plate segment PLB, or, to put it another way, positive charges are drawn from the bit lines BLi into said memory cells MC. These opposite charge currents compensate one another on the bit lines BLi, so that excess charges of appreciable magnitude no longer have to be carried away by said bit lines. This means that additional components for carrying away such charges are unnecessary. Since the plate segments PLA, PLB are arranged directly adjacent to one another, large balancing currents on the bit lines BLi are avoided.

FIG. 3 reveals that the two plate segments PLA, PLB are short-circuited by means of the control signal EQ of the short-circuiting element SH at an instant $t_2$. This results in charge balancing between the two plate segments, so that they then have a common mid-potential lying between the two supply potentials VDD, GND of the memory. After the short-circuiting, once the control signal EQ has assumed a low level again, the two plate potentials $V_{PA}$, $V_{PB}$ are brought to levels which are opposite to those which they had prior to the short-circuiting. The effect achieved by the short-circuiting is that only relatively little energy is necessary for charge reversal of the plate segments. In order to achieve the artificial aging of the memory cells MC, this individual pulse just outlined is followed by further pulses of the plate potentials $V_{PA}$, $V_{PB}$.

Although all of the word lines WLi of the plate segments PLA, PLB are activated simultaneously in the test operating mode in the case of the exemplary embodiment outlined here, other kinds of embodiments are possible in which just some of the word lines assigned to each plate segment are activated in the test operating mode. By way of example, merely one word line may be activated for each plate segment. Furthermore, it is possible for each plate segment to be assigned more than four word lines, of which all or some are activated in the test operating mode.

Figure 2:
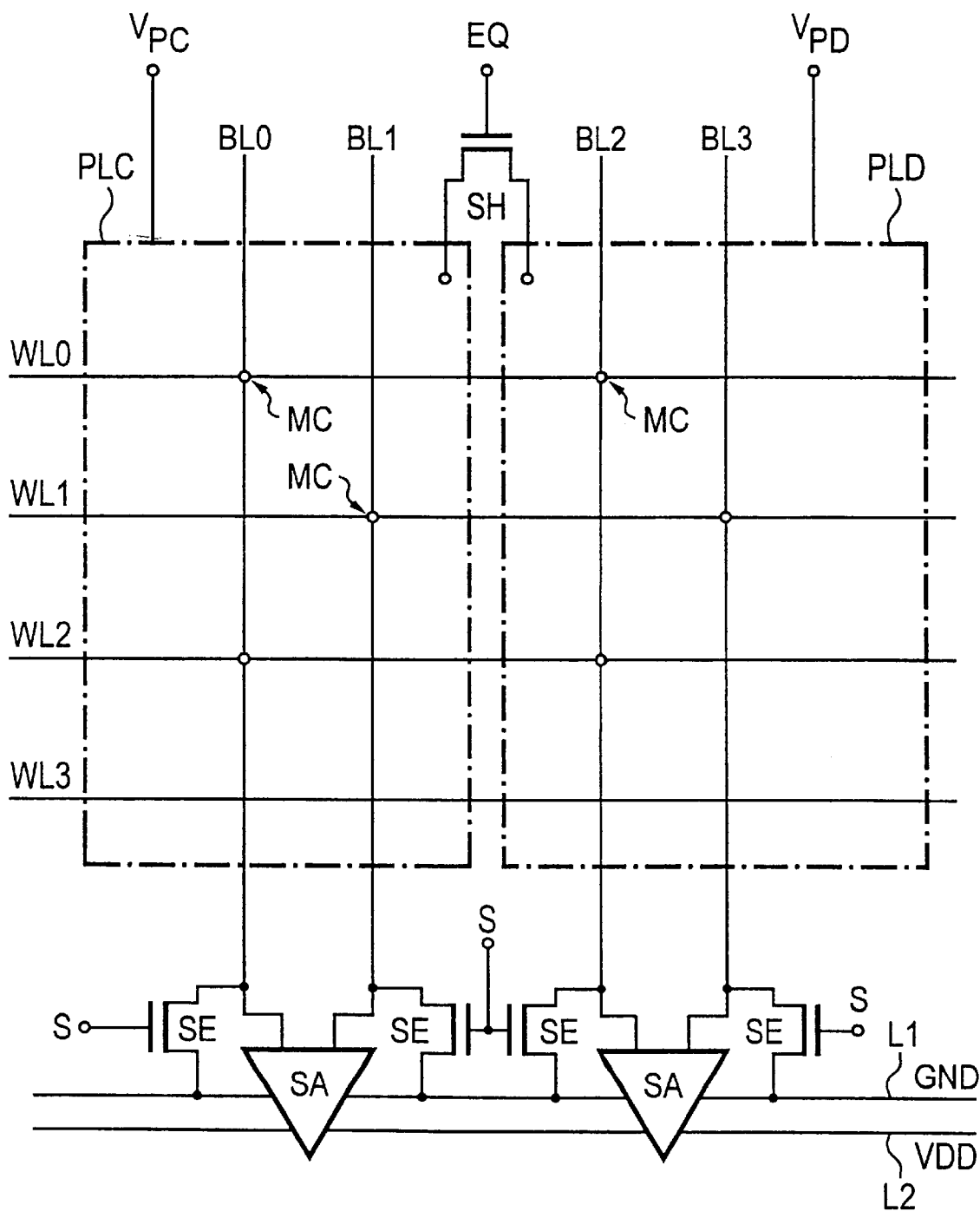
FIG. 2 shows a second exemplary embodiment.

FIG. 2 reveals a second exemplary embodiment of the invention, which is likewise an integrated memory of the FRAM type. Its memory cells MC are constructed just like those in FIG. 1. They are once again arranged at crossover points of bit lines BLi and word lines WLi. Just a few of the memory cells MC are indicated in FIG. 2 with respect to their arrangement. In this exemplary embodiment, the plate segments PLC, PLD do not run parallel to the word lines, as is the case in the exemplary embodiment from FIG. 1, but rather parallel to the bit lines BLi. Each plate segment PLC, PLD is assigned two of the bit lines BLi. It goes without saying that in other exemplary embodiments a larger number of bit lines is also possible for each plate segment. Of the numerous word lines WLi which cross the bit lines BLi, FIG. 2 illustrates just four. The plate segments PLC, PLD are once again connected to one another via a short-circuiting element SH in the form of an n-channel transistor.

The two bit lines BLi of each plate segment are connected to the inputs of a sense amplifier SA. The sense amplifiers SA are supplied with the low supply potential GND via a first potential line L1 and with a high supply potential VDD via a second potential line L2. Each bit line BLi is connected to the first potential line L1 via a respective short-circuiting element SE in the form of an n-channel transistor. The gates of the short-circuiting elements SE are connected to a signal S.

The method of operation of the circuit shown in FIG. 2 is as follows: in the normal operating mode, just one of the word lines WLi is activated. Moreover, only the potential of one of the plate segments PLC, PLD is subsequently pulsed, whereas the potential of the other plate segment remains constant. Consequently, an access is made to precisely one of the memory cells MC. In the event of a read access, the potential established on the respective bit line BLi is amplified by the sense amplifier SA.

In the test operating mode, a plurality of the word lines WLi are activated simultaneously, so that a large number of memory cells MC are conductively connected to the bit lines BLi. Afterwards, both plate segments PLC, PLD are simultaneously pulsed with opposite levels. The profile of the plate potentials $V_{PC}$, $V_{PD}$ and also the control signal EQ of the short-circuiting element SH are identical to those in the exemplary embodiment in accordance with FIG. 1 and, therefore, can also be gathered from FIG. 3.

The short-circuiting elements SE are, in principle, not in the on state in the normal operating mode. At the same time as the pulsing of the plate potentials $V_{PC}$, $V_{PD}$, the short-circuiting elements SE are switched on by means of the signal S in the test operating mode, so that all the bit lines BLi are connected to the first potential line L1. While the potential of one of the plate segments PLC, PLD has a positive edge and, consequently, positive charges flow onto the associated bit lines from the memory cells MC connected to said plate segment, the potential of the respective other plate segment has a negative edge, so that negative charges flow onto the associated bit lines from the memory cells MC connected to said plate segment. Both the positive charges from the bit line assigned to one plate segment and the negative charges from the bit line assigned to the other plate segment flow via the short-circuiting elements SE to the first potential line L1. In this way, the charge currents provided with different signs are compensated by means of the first potential line L1. Thus, in a manner similar to that in the exemplary embodiment in accordance with FIG. 1, the charges generated by the pulsing of the plate potentials are reduced.

Although each plate segment PLC, PLD is assigned just two of the bit lines BLi in the exemplary embodiment in accordance with FIG. 2, it is possible for there to be a larger number of bit lines for each plate segment in other exemplary embodiments, which bit lines are connected to the first potential line L1 via a respective short-circuiting element SE.

It is also the case in the exemplary embodiment in accordance with FIG. 2 that a modification can be made to the effect that only one of the word lines WLi or all the word lines WLi simultaneously are activated in the test operating mode.

It should be noted that in the exemplary embodiments illustrated in FIGS. 1 and 2, in reality there are a large number of plate segments PLA, PLB; PLC, PLD present, two adjacent segments in each case being pulsed simultaneously in the test operating mode.

In other exemplary embodiments of the invention, it is also possible for more than two plate segments to be pulsed simultaneously in the test operating mode. As a result, the number of memory cells MC addressed simultaneously can be increased further. Further short-circuiting elements may then be provided which connect together all the plate segments to be pulsed simultaneously in the test operating mode and whose control terminals are connected to the control signal EQ.

Through the above-described charge compensation during the pulsing of the plate segments in the test operating mode, the currents on the bit lines can be reduced or the charges on the bit lines can be compensated. Moreover, a large number of memory cells can be simultaneously subjected to an artificial aging process. Through the short-circuiting elements SH, the power consumption during test operation is reduced.

Although the invention has been explained here using integrated memories in the form of FRAMs, it can be applied to all memories in which accesses are made to the memory cells by means of pulsed plate potentials.

After the pulsing of the plate segments in the test operating mode, said pulsing serving to artificially age the memory cells, access can be made to each individual memory cell in order to check its functionality. This is done—if appropriate after a previous write access—by means of a read access which is carried out exactly as in the normal operating mode.

What is claimed is:

1. An integrated memory, comprising:

a plurality of memory cells arranged within a cell array along bit lines, word lines and at least two plate segments, and each of said memory cells having a selection transistor and a storage capacitor;

each said storage capacitor having a first electrode connected via a respectively associated said selection transistor to one of said bit lines and a second electrode connected to one of said plate segments;

each said selection transistor having a control terminal connected to one of said word lines;

wherein, in a normal operating mode, a potential of only one of said plate segments in each case is pulsed in an event of accesses to said memory cells; and wherein, in a test operating mode, the potentials of both said plate segments are pulsed simultaneously.

2. The integrated memory according to claim 1, wherein the potentials of the two plate segments are pulsed simultaneously in each case in mutually opposite directions in the test operating mode.

3. The integrated memory according to claim 2, wherein the potentials of said two plate segments are pulsed, in the test operating mode, in each case by two successive pulses with opposite levels in each case; and wherein a short-circuiting element is connected between said two plate segments and said short-circuiting element is temporarily switched on prior to a second pulsing of the plate potentials.

4. The integrated memory according to claim 2, wherein said plate segments run parallel to said word lines; and in the test operating mode, for each plate segment, at least one of the associated word lines is activated during the pulsing of the plate potentials.

5. The integrated memory according to claim 4, wherein more than one word line is activated simultaneously for each plate segment in the test operating mode.

6. The integrated memory according to claim 2, wherein said plate segments run parallel to said bit lines;

in the test operating mode, for each plate segment, at least one of the associated word lines is activated during the pulsing of the plate potentials;

including a potential line for a fixed potential; and at least two short-circuiting elements, via which one of the bit lines assigned to each said plate segment is respectively connected to said potential line and which are both in an on state in the test operating mode during the pulsing of the plate potentials.

7. The integrated memory according to claim 6, wherein more than one word line is activated simultaneously for each plate segment in the test operating mode.

8. The integrated memory according to claim 1, wherein said two plate segments are disposed adjacent one another.

* * * * *